US011824514B2

(12) United States Patent
Knapp et al.

(10) Patent No.: US 11,824,514 B2
(45) Date of Patent: Nov. 21, 2023

(54) SAW DEVICE WITH SUPPRESSED SPURIOUS MODE SIGNALS

(71) Applicant: RF360 SINGAPORE PTE. LTD., Singapore (SG)

(72) Inventors: Matthias Knapp, Munich (DE); Ingo Bleyl, Munich (DE)

(73) Assignee: RF360 Singapore Pte. Ltd., San Diego, CA (US)

( * ) Notice: Subject to any disclaimer, the term of this patent is extended or adjusted under 35 U.S.C. 154(b) by 736 days.

(21) Appl. No.: 16/615,910

(22) PCT Filed: Apr. 23, 2018

(86) PCT No.: PCT/EP2018/060322
§ 371 (c)(1),
(2) Date: Nov. 22, 2019

(87) PCT Pub. No.: WO2018/215152
PCT Pub. Date: Nov. 29, 2018

(65) Prior Publication Data
US 2020/0144981 A1 May 7, 2020

(30) Foreign Application Priority Data
May 24, 2017 (DE) .......................... 102017111448.3

(51) Int. Cl.
*H03H 9/02* (2006.01)
*H03H 3/10* (2006.01)

(52) U.S. Cl.
CPC .......... *H03H 9/02574* (2013.01); *H03H 3/10* (2013.01); *H03H 9/02559* (2013.01); *H03H 9/02834* (2013.01); *H03H 9/02866* (2013.01)

(58) Field of Classification Search
CPC .. H03H 3/10; H03H 9/02559; H03H 9/02574; H03H 9/02834; H03H 9/02866
USPC ................................ 73/579; 310/313 B, 588
See application file for complete search history.

(56) References Cited

U.S. PATENT DOCUMENTS

| 4,494,091 A | 1/1985 | Goll |
| 5,081,389 A * | 1/1992 | Abbott ............... H03H 9/02559 |
| | | 29/25.35 |
| 6,259,187 B1 * | 7/2001 | Abe ....................... H03H 9/174 |
| | | 310/358 |
| 7,471,027 B2 * | 12/2008 | Kando ................. H03H 9/0222 |
| | | 310/313 R |
| 8,035,464 B1 | 10/2011 | Abbott et al. |
| 2004/0133348 A1 * | 7/2004 | Kalantar-Zadeh ... G01N 29/022 |
| | | 702/2 |
| 2009/0236935 A1 | 9/2009 | Kando |

(Continued)

FOREIGN PATENT DOCUMENTS

| EP | 2490333 A1 | 8/2012 |
| WO | 2017043394 A1 | 3/2017 |

OTHER PUBLICATIONS

International Search Report and Written Opinion dated Jul. 12, 2018, corresponding to Application No. PCT/EP2018/060322.

*Primary Examiner* — Tan H Trinh
(74) *Attorney, Agent, or Firm* — RF360 Singapore Pte. Ltd.

(57) ABSTRACT

For a multilayer SAW device arranged on a carrier substrate it is proposed to use a specific material for the carrier substrate. If a silicon material having a selected range of Euler angles is used as a material for the carrier substrat improved suppression of disturbing signals is achieved.

14 Claims, 4 Drawing Sheets

(56) References Cited

U.S. PATENT DOCUMENTS

| | | | |
|---|---|---|---|
| 2011/0158885 A1* | 6/2011 | Hayashida | C01B 33/033 423/350 |
| 2012/0038431 A1* | 2/2012 | Jaakkola | H03H 9/02448 257/E21.598 |
| 2012/0074809 A1 | 3/2012 | Nishiyama et al. | |
| 2012/0086308 A1 | 4/2012 | Obata et al. | |
| 2015/0013461 A1* | 1/2015 | Pollard | G10K 11/36 73/579 |
| 2015/0028720 A1 | 1/2015 | Kando | |
| 2015/0102705 A1* | 4/2015 | Iwamoto | H03H 9/171 310/313 B |
| 2016/0182009 A1* | 6/2016 | Bhattacharjee | H03H 9/02574 310/313 R |
| 2016/0306111 A1* | 10/2016 | Lambert | G02B 6/125 |
| 2017/0026025 A1 | 1/2017 | Jäger et al. | |
| 2017/0033764 A1* | 2/2017 | Inoue | H03H 9/17 |
| 2017/0063339 A1* | 3/2017 | Burak | H03H 9/02574 |
| 2017/0117872 A1 | 4/2017 | Morton et al. | |
| 2017/0214385 A1* | 7/2017 | Bhattacharjee | H03H 9/14564 |
| 2018/0152170 A1* | 5/2018 | Iwamoto | H03H 9/72 |
| 2021/0265971 A1* | 8/2021 | Knapp | H03H 9/02866 |
| 2021/0320642 A1* | 10/2021 | Bleyl | H03H 3/08 |

\* cited by examiner

SAW DEVICE WITH SUPPRESSED SPURIOUS MODE SIGNALS

CROSS-REFERENCE TO RELATED APPLICATIONS

This application is a national stage application under 35 U.S.C. 371 of PCT/EP2018/060322, filed Apr. 23, 2018, which claims the benefit of German Application No. 102017111448.3, filed May 24, 2017, both of which are incorporated herein by reference in their entireties.

Today, SAW devices as used in frequency filters for wireless communication devices need to comply with a number of a specifications. Newly introduced standards or new developments continuously require the specifications to be adapted and the devices to be improved. Operation of wireless devices in a multiple of bands that may be coupled in a carrier aggregation mode, need a high frequency stability under different temperature conditions and a good suppression of spurious modes out of band. Especially when operating the SAW device under high power level require respective solutions each that often need to be combined in one device.

SAW devices using leaky surface waves show losses due to an undesired radiation of acoustic energy into the bulk substrate. Further, additional bulk modes can reach the electrodes of the transducer and produce a parasitic signal that may be disturbing the operation in the used frequency band. Further losses are due the excitation of higher modes like plate modes or the second harmonics which is often referred to as H2 mode.

One approach to reduce these losses and to cancel parasitic signals is the use of a piezoelectric film at the surface of a support substrate. In such a layered structure the parasitic bulk mode may be guided within the substrate and not near the top surface of the piezoelectric film where the SAW transducer electrodes are arranged, resulting in unwanted spurious signals.

Further problems arise if further functional layers are introduced into the layered structure of the SAW device, for example a compensation layer to reduce the temperature coefficient of frequency and thus, to improve the temperature stability of the device. A layer that can reduce the temperature coefficient preferably comprises a material having a positive TCF, like silicon oxide for example. Each further layer in such a multilayer structure enhances the probability that undesired bulk modes or other spurious modes are produced within such a structure.

From published US patent application, US2015/0102705 A1, an elastic surface wave device is known that allows to confine the main mode of the elastic wave within a layer system. This elastic surface wave device includes a high acoustic velocity film, a low acoustic velocity film and a piezoelectric film arranged in that order on the top of a carrier substrate in order to reach the desired object. Nevertheless, the impact of the disclosed layer stack on the excitation and position of additional higher modes, like plate modes or second harmonics has not been investigated.

It is an object of the present invention to reduce signals originating from spurious modes like plate modes or H2 mode as well as signals resulting from bulk modes.

At least one of these objects is met by a SAW device according to claim 1. Improved embodiments that may meet other objectives are given in dependent sub-claims.

The invention provides a SAW device comprising a carrier substrate, a piezoelectric layer arranged on top of the carrier substrate and an IDT electrode arranged on top of the piezoelectric layer. The inventors have found out that a proper selection of a material for the carrier substrate can improve the SAW device in view of reducing disturbing signals resulting from disturbing modes like higher harmonics and bulk modes. A proper selection of a material for the substrate allows to confine the energy of the main mode of the SAW device within a piezoelectric layer or within a layer system, the layer system comprising the piezoelectric layer and being arranged on top of the carrier substrate. At the same time this material allows higher modes or bulk modes to leak into the substrate such that the amplitudes of spurious mode signals are substantially reduced. Hence, the material of the carrier substrate is selected such that the wave energy of a spurious mode is is radiated into the carrier substrate while the wave energy of the used main mode is localized near the top surface of the piezoelectric layer.

A proper material that can be used for the carrier substrate to yield the desired result comprises a crystalline silicon with selected Euler angles that are chosen within a given range. A first useful material provides a crystal cut according to Euler angles of (0°±10°, 0°±10°, 45°±10°).

A second material that can be used provides a crystal cut with according Euler angles of (45°±10°, 54°±10°, 0°±10°). These two silicon materials with selected crystal cuts support the leakage of higher modes and bulk modes into the carrier substrate and hence reduce the propagation of these disturbing modes near the top surface of the SAW device. Thereby the disturbing modes are prevented from reaching the IDT electrodes and hence from producing disturbing signals. A further effect of the proposed new carrier substrate material is that the frequency of disturbing modes, although substantially reduced, can be shifted into a frequency range that is not disturbing operation of the SAW device in another frequency band the SAW device is designed for. It has been found that the Euler angles of a crystalline substrate material have an impact on the preferred propagation direction of an acoustic mode within the selected substrate material. As the impact of a substrate material having preferred Euler angles onto the propagation of acoustic waves can be made different for the main mode and the spurious or bulk modes, mode propagation of main mode and bulk or spurious mode propagation is decoupled. Most important is the fact that by proper selection of the substrate material the main mode is not affected with regard to the respective signal's frequency, amplitude and flank sharpness. As a proof of this effect it can be shown that energy distribution of the main mode within the layer structure of the SAW device is unchanged in a SAW device of the invention and different from the respective energy distribution for spurious or bulk modes.

According to a further embodiment a high acoustic velocity layer is arranged between the carrier substrate and the piezoelectric layer of the AW device. The material of the high acoustic velocity layer is chosen such that the acoustic velocity in the high acoustic velocity layer is higher than the acoustic velocity in the carrier substrate. It has been found that depending on the material of the high acoustic velocity layer, and on the thickness of this layer, signals resulting from spurious modes can be further suppressed.

A useful material for the high acoustic velocity layer is polycrystalline silicon. A preferred thickness of the high acoustic velocity layer ranges from $0.05 \times \lambda$ to $1.0 \times \lambda$ where $\lambda$ is the wavelength of the main mode of the acoustic wave within the high acoustic velocity layer. Depending on the acoustic velocity within the high acoustic velocity layer a thickness thereof can be optimized to result in a desired mode suppression.

A further improvement of the SAW device of the invention comprises a TCF compensating layer that has a positive temperature coefficient of frequency. That TCF compensating layer is preferably arranged between the high acoustic velocity layer and the piezoelectric layer. A further possible arrangement is above the IDT electrode.

The TCF compensating layer comprises a material having a positive temperature coefficient of frequency like $SiO_2$ Fluorine doped $SiO_2$ or doped $SiO_2$ using different dopants. Depending on the thickness of the TCF compensating layer a respective amount of the wave propagates within the TCF compensating layer. As the positive TCF of this layer compensates the negative TCF of most of the piezoelectric materials the TCF compensation can be improved by enhancing the thickness of this layer.

A preferred thickness of the TCF compensating layer ranges from $0.05 \times \lambda$ to $1.0 \times \lambda$.

A further parameter that can be varied within the scope of the invention is the thickness of the piezoelectric layer. Benefit of reducing the thickness of the piezoelectric layer is an improved guiding of the leaky surface wave. Additionally, the coupling constant can be enhanced by optimizing the thickness of the piezoelectric film. Further, the TCF compensation can be improved by reducing the thickness of the piezoelectric layer and thereby increasing the thickness ratio of of TCF compensating layer and piezoelectric layer.

When further optimizing the SAW device of the invention materials and relative thicknesses of all layers of the multilayer structure of the SAW device have to be regarded and taken into account. It is clear that the exact multilayer structure in view of material and thickness of the single layers has a great impact on the exciting and propagation of main mode and higher and spurious modes. As a result, a different layer structure of a SAW device may cause different modes that can propagate within the system and hence, different modes have to be suppressed or the signals thereof have to be cancelled.

In the following the invention is explained in more detail with regard to specific embodiments and the accompanying figures.

Figure 1A:
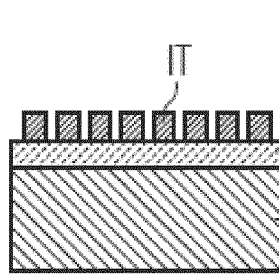
FIG. 1 shows different examples of SAW devices according to the invention in a schematic cross-section.

FIG. 1A shows a SAW device according to the simplest embodiment of the invention in a schematic cross-section. The SAW device comprises a carrier substrate SU, a piezoelectric layer PL arranged on top of the carrier substrate SU and an interdigital transducer electrode IT arranged on top of the piezoelectric layer PL. The material of the carrier substrate SU is chosen from silicon having a specific range of cut angles with Euler angles of (0°±10°, 0°±10°, 45°±10°). A similar working embodiment comprises a substrate material of silicon having Euler angles of (45°±10°, 54°±10°, 0°±10°). The thickness of the carrier substrate is set to provide sufficient mechanical strength to carry the layers and structures disposed on top of the carrier substrate.

The piezoelectric layer PL may comprise any piezoelectric material that is useful for a SAW device. Exemplary embodiments comprise lithium tantalate or lithium niobate. Other piezoelectric materials like AlN and ZnO are possible too.

The interdigital transducer electrode IT is depicted only schematically with a few electrode fingers and may comprise more electrode fingers and one or more interdigital transducer, reflector or any other electrode structure that is commonly used on top of SAW devices. The thickness of the piezoelectric layer PL is chosen depending on resonance frequency and resonator specifications, preferably of about 2 μm or less.

A SAW device according to FIG. 1A is improved in view of guiding of the acoustic main mode and any disturbing bulk mode or another spurious mode. The main mode that yields the desired signal of the SAW device is concentrated and confined near the surface of the piezoelectric layer PL, while most of the spurious or bulk mode leaks into the substrate SU and thus does not contribute to the transfer curve of the SAW device anymore and yields no disturbing signal.

Figure 1B:
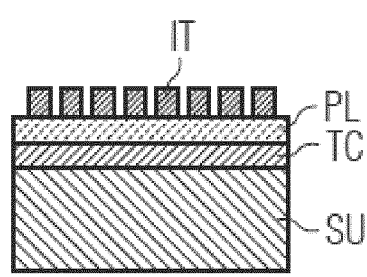

FIG. 1B shows an improved embodiment where a TCF compensating layer TC is disposed between the piezoelectric layer PL and the carrier substrate SU as shown in FIG. 1A. This TCF compensating layer may be chosen from any material having a positive TCF or a TCF that is at least higher than the TCF of the piezoelectric layer PL. A layer that can reduce the temperature coefficient TCF preferably comprises silicon oxide. A preferred thickness X3 of this layer is within the range from $0.1\lambda$ and $1.0\lambda$.

Figure 1C:
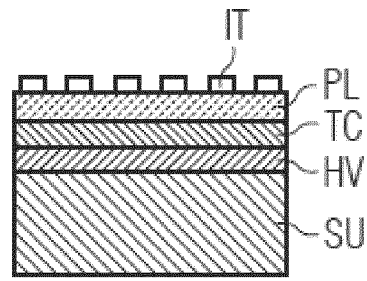

In a further improvement the invention is shown in FIG. 1C. A further functional layer HV is introduced into the multilayer structure of the inventive SAW device. A high acoustic velocity layer is arranged between the carrier substrate SU and a TCF compensating layer TC.

A preferred thickness X2 of this layer is within the range from $0.05\lambda$ and $1.0\lambda$.

Figure 2:
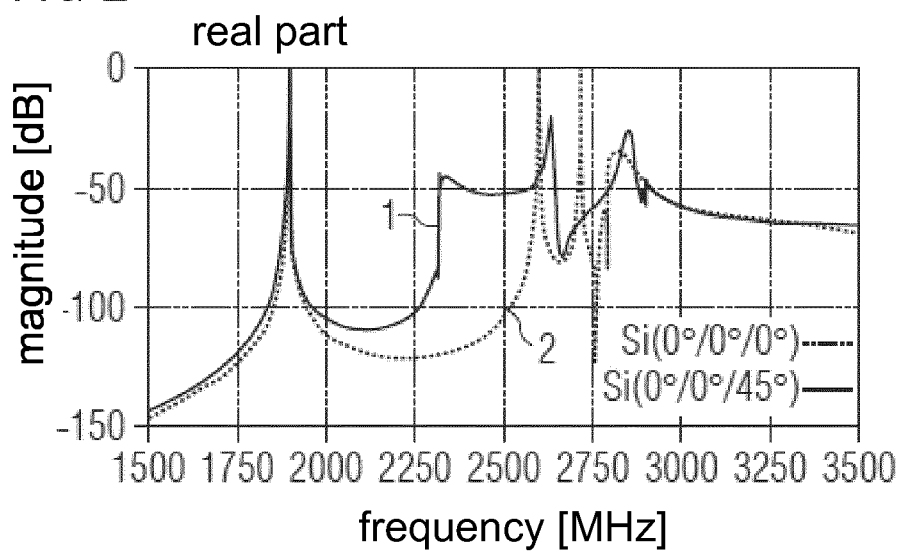
FIG. 2 shows the real part of an admittance curve of a SAW device according to the invention.
Figure 3:
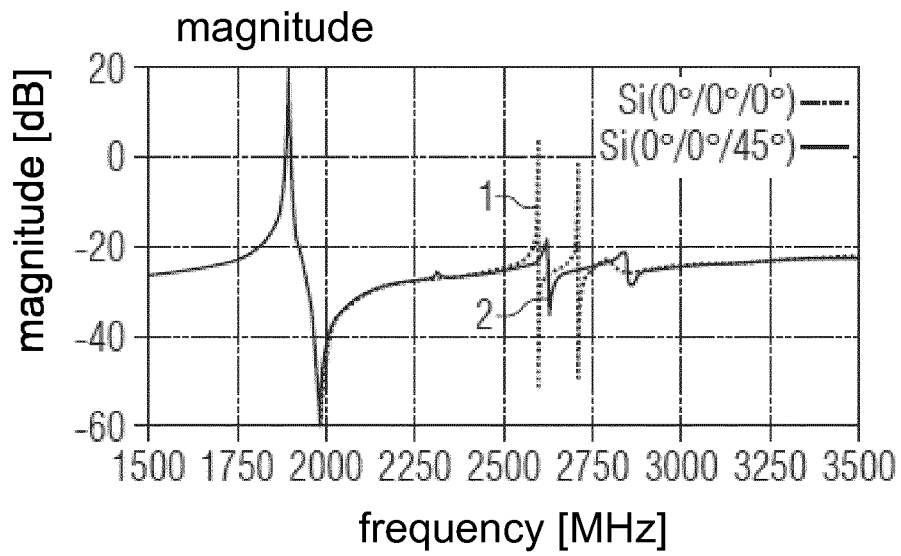
FIG. 3 shows a respective absolute part in dB of the admittance of the same SAW device.

FIGS. 2 and 3 show the admittance curves for a SAW single one port resonator according to FIG. 1B. FIG. 2 shows the real part of the admittance where, as a reference, curve 1 complies to a SAW device as shown in FIG. 1A made on a silicon material with Euler angles of (0°, 0°, 0°). Curve 2 refers to an inventive SAW device with a silicon material having Euler angles of (0°, 0°, 45°). As can best be seen in FIG. 2, a spurious mode signal at about 2300 MHz is substantially reduced at a SAW device according to the invention. The main mode at about 1900 MHz remains unchanged and delivers a sharp signal. FIG. 3 shows the absolute part in dB of the admittance of the same device where curve 1 is the admittance of the reference example while curve 2 complies to the inventive device. It can be seen that disturbing peaks at about 2600 to 2700 MHz are also substantially reduced in amplitude.

Figure 4:
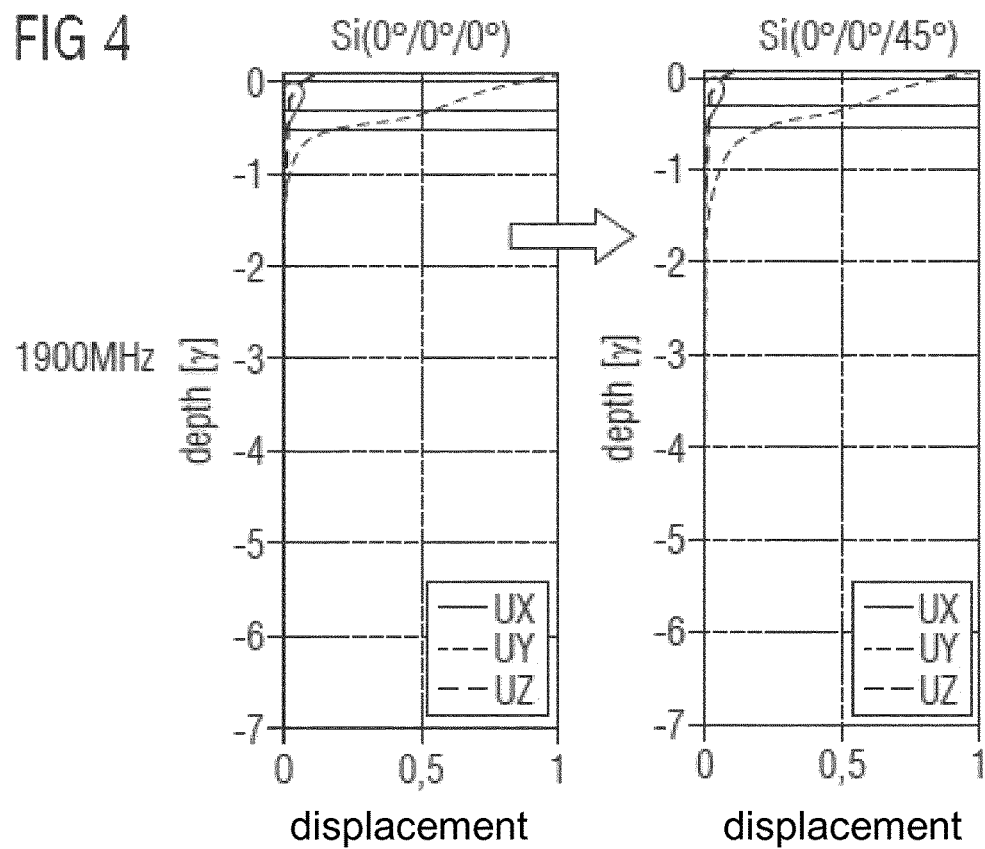
FIG. 4 shows the wave energy in dependence on the depth under the top surface of the SAW device for the frequency of the main mode.

The positive effect of the inventive SAW device described above can best be explained with regard to FIGS. 4 and 5. FIG. 4 shows the distribution of the wave energy of the acoustic main mode in dependence on the depth that is the distance to the top surface of the piezoelectric PL (Please provide new figures showing only the curve that supports the invention best. The original figures of your invention report comprise three curves ux, uy and uz. We assume that the curves depict amplitudes along respective coordinate axes. It seems that the greatest impact is along uy). In the left part of FIG. 4 a SAW device with a commonly used silicon substrate is shown while in the right part of FIG. 4 the main mode in an inventive SAW device with a silicon material of a specific Euler angle is depicted. The main mode has a frequency around 1900 MHz.

Comparing the left part according to the art with the right part according to the invention shows that the energy of the main mode is concentrated near the surface of the piezoelectric layer and thus does not intrude into the carrier substrate. Concentrating the energy of the main mode near the top surface guarantees low losses as a high amount of the main mode is recovered as an electrical signal at the interdigital electrode.

Figure 5:
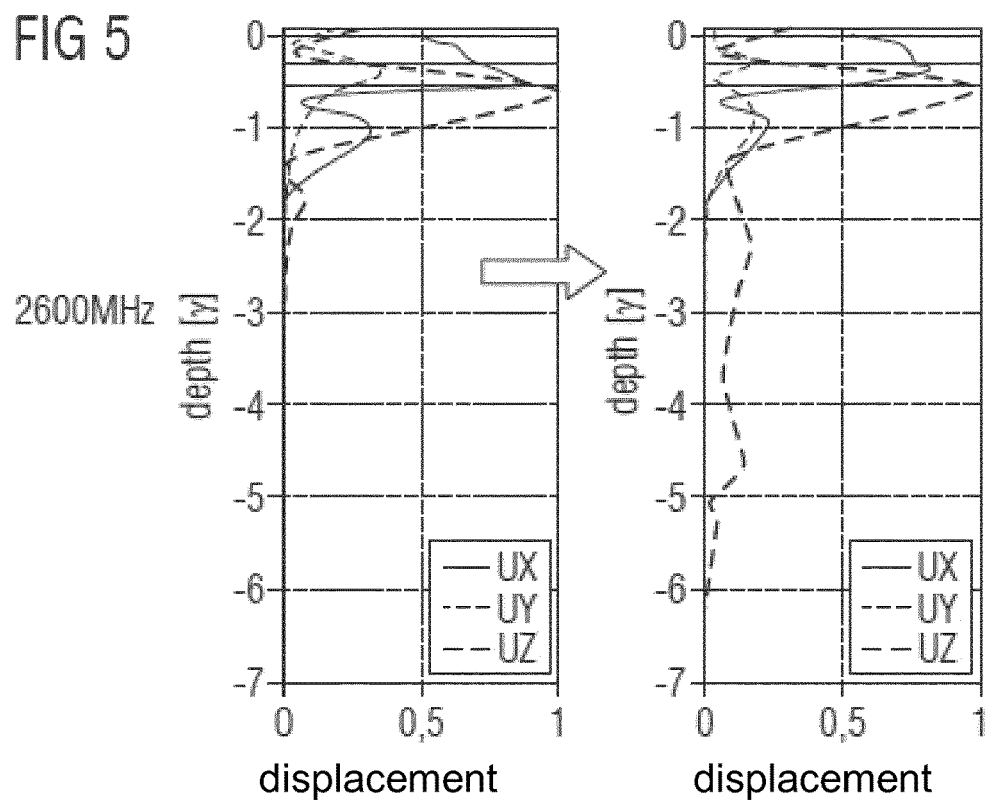
FIG. 5 shows the amplitude of the spurious mode in dependence on the depth under the top surface of the SAW device.

In FIG. 5 the two devices are regarded at a frequency of about 2600 MHz according to a disturbing mode that is present in the admittance curve of the SAW device according to the art. In this case the known SAW device concentrates energy of the disturbing mode in another area that is near the top of the silicon carrier substrate. When regarding the right part of FIG. 5 according to an inventive SAW device it can be seen that the energy of the disturbing mode can penetrate deeper into the SAW device and the carrier substrate SU and is no longer concentrated near the top surface thereof only. When comparing the curves from FIG. 4 and FIG. 5 it becomes clear that the main mode remains nearly unchanged when implementing the invention. However, the disturbing mode is drawn deeper into the SAW substrate (carrier substrate) than before and is hence prevented from reaching the IDT electrodes and hence prevented from producing a disturbing signal.

In a further improvement according to the structure of FIG. 1C a further functional layer is introduced into the multilayer structure of the inventive SAW device. A high acoustic velocity layer is arranged between the carrier substrate SU and the TCF compensating layer TC. This high acoustic velocity layer provides a high velocity of the acoustic signal that is higher than the acoustic velocity of the same wave in the carrier substrate as well as in the piezoelectric layer. A preferred material for this layer comprises polycrystalline silicon. It is preferred to make this layer as thin as one wavelength or less. A preferred thickness X2 of this layer is within the range from 0.05λ and 1.0λ. It has been found that this embodiment provides a further improvement of mode suppression in a high frequency region above the frequency of the main mode that is above the pass band of the SAW device.

Figure 6:
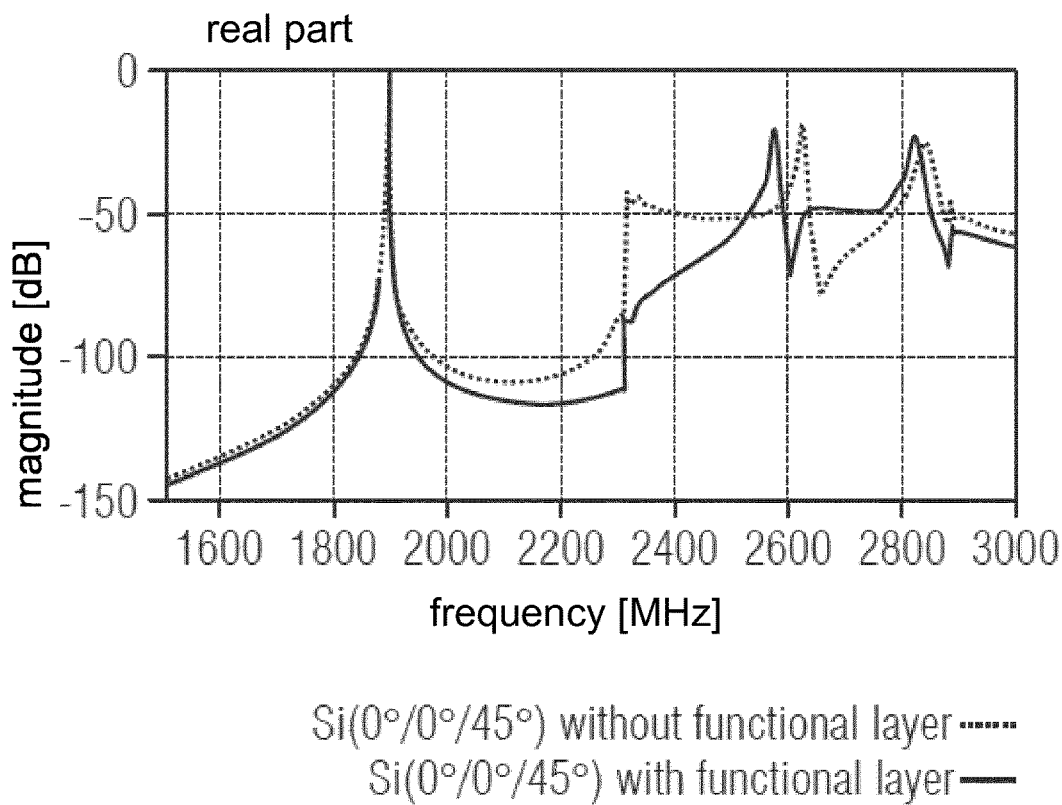
FIG. 6 shows an admittance curve of a further embodiment according to the invention.

FIG. 6 shows the real part of the admittance curve of this embodiment as curve 2. As a reference, curve 1 shows the admittance of a SAW device according to the art. It can clearly be seen that at a frequency of about 2300 MHz a substantial reduction of a disturbing signal is achieved. Signals according to higher modes of the SAW device at about 2600 MHz and higher remain but are shifted in frequency.

Figure 7:
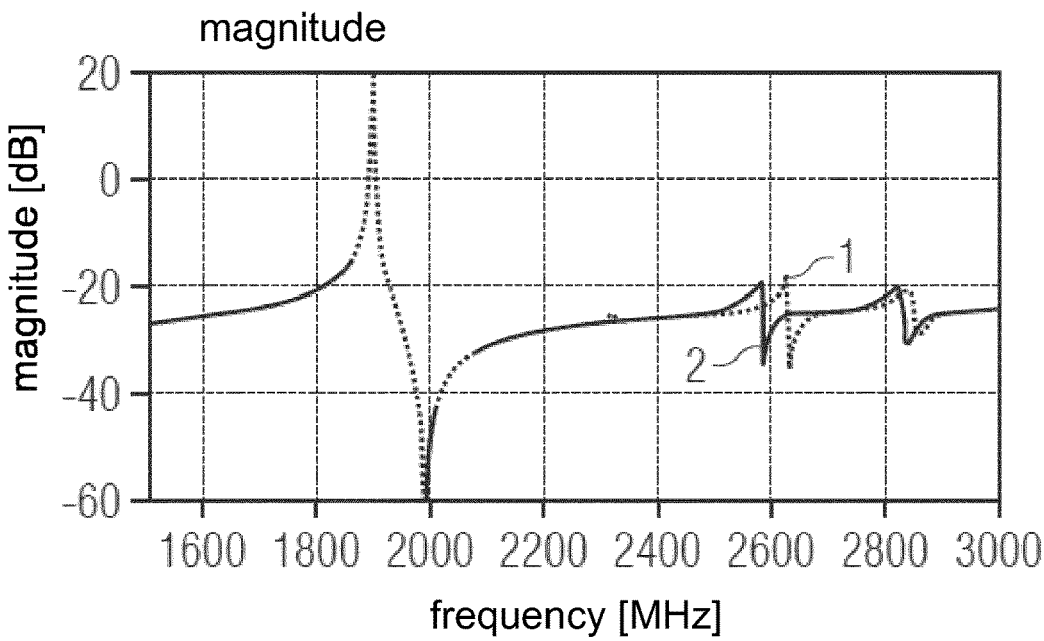
FIG. 7 shows the absolute part in dB of the same admittance curve.

FIG. 7 shows the absolute part in dB of the admittance of the same SAW device. The most advantageous effect of this embodiment occurs at a frequency of 2300 MHz where in the graph (curve 2) a disturbing mode that is visible at curve 1 is totally suppressed. The main resonance of the SAW device according to its pass band frequency remains unchanged. The vanishing of the disturbing mode is a consequence of the changing velocity difference and therefore different boundary conditions due to introduction of an additional fast velocity layer.

Figure 8:
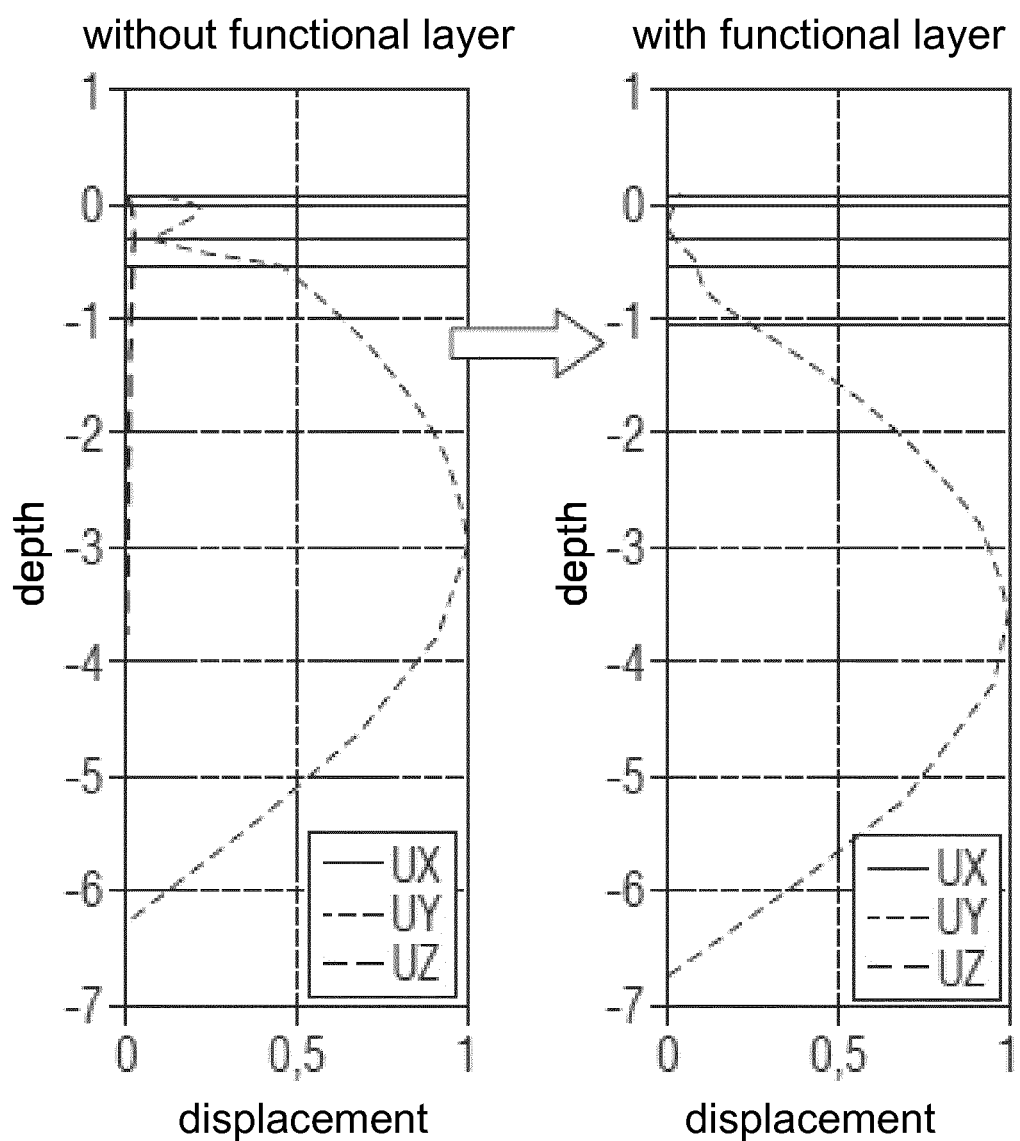
FIG. 8 shows the amplitude of a bulk mode in dependence on the depth under the top surface of the SAW device.

FIG. 8 depicts the depth profile of the disturbing mode in an inventive SAW device with an acoustic velocity layer HV compared to a SAW device without this layer. The curve according to the ladder one is depicted in the left part of FIG. 8 while the curve according to the SAW device with functional layer HV is depicted in the right part of FIG. 8. It can be seen that the disturbing mode is drawn deeper into the carrier substrate as the maximum of the curve is deeper within the carrier substrate of the SAW device. This disturbing mode complies to the bulk wave and its deleterious effect is eliminated as the excitement of the bulk mode is minimized with this embodiment.

The invention has been explained with reference to a small number of embodiments only but it is not restricted to these embodiments. Especially, single layers of the multilayer structure of the SAW device can be embodied with other materials and other thicknesses too. It is clear that each new multilayer structure can potentially promote additional specific disturbing modes. As resonance affects at the interface between two adjacent layers can occur, the resonance frequency thereof depends on the the material and specific thickness of these layers. However, the invention allows to reduce any disturbing mode without reducing the amplitude of the main signal. Modes that cannot be sufficiently suppressed can be shifted in their frequency at a location where no other band is present that would be affected by the disturbing signal.

LIST OF REFERENCE SYMBOLS

SU carrier substrate
IT IDT electrode
PL piezoelectric layer
TC temperature compensation layer
HV high acoustic velocity layer
1 admittance of reference sample
2 admittance of resonator according to the invention

The invention claimed is:

1. A surface acoustic wave (SAW) device, comprising:
   a carrier substrate comprising a crystalline silicon with a crystal cut according to Euler angles of (45°±10°, 54°±10°, 0°±10°);
   a piezoelectric layer arranged on top of the carrier substrate; and
   an interdigital transducer (IDT) electrode arranged on top of the piezoelectric layer.

2. The SAW device of claim 1, wherein the crystal cut according to Euler angles of (45°±10°, 54°±10°, 0°±10°) is such that wave energy of a spurious mode is radiated predominantly within the carrier substrate while wave energy of a main mode is localized near a top surface of the piezoelectric layer.

3. The SAW device of claim 1, wherein a high acoustic velocity layer is arranged between the carrier substrate and the piezoelectric layer, wherein the acoustic velocity in the high acoustic velocity layer is higher than in the carrier substrate.

4. The SAW device of claim 3, wherein the high acoustic velocity layer has a thickness of x2 according to 0.05λ<x2<λ wherein λ is the wavelength of a main mode of the surface acoustic wave device.

5. The SAW device of claim 3, wherein the high acoustic velocity layer comprises polycrystalline silicon.

6. The SAW device of claim 3, further comprising a temperature coefficient of frequency (TCF) compensating layer having a positive TCF and being arranged between the high acoustic velocity layer and the piezoelectric layer.

7. The SAW device of claim 6, wherein the TCF compensating layer comprises $SiO_2$, Fluorine doped $SiO_2$ or other doped $SiO_2$ based materials.

8. The SAW device of claim 6, wherein the TCF compensating layer has a thickness of x3 according to $0.05\lambda < x3 < \lambda$.

9. The SAW device of claim 1, further comprising a temperature coefficient of frequency (TCF) compensating layer having a positive TCF and being arranged above the IDT electrode.

10. The SAW device of claim 9, wherein the TCF compensating layer comprises $SiO_2$, Fluorine doped $SiO_2$ or other doped $SiO_2$ based materials.

11. The SAW device of claim 9, wherein the TCF compensating layer has a thickness of x3 according to $0.05\lambda < x3 < \lambda$.

12. The SAW device of claim 1, wherein the piezoelectric layer has a thickness of x4 according to $0.1\lambda < x4 < \lambda$.

13. The SAW device of claim 1, wherein the IDT electrode comprises a multilayer structure comprising aluminium.

14. The SAW device of claim 1, wherein the IDT electrode has a thickness of x5 according to $0.05\lambda < x5 < 0.2\lambda$.

* * * * *